United States Patent [19]

Richter et al.

[11] Patent Number: 4,570,336
[45] Date of Patent: Feb. 18, 1986

[54] DEVICE FOR MOUNTING ELECTRONIC COMPONENTS TO CIRCUIT BOARD

[75] Inventors: Martin Richter, Marloffstein; Josef Schweiger, Mohrendorf, both of Fed. Rep. of Germany

[73] Assignee: Siemens Aktiengesellschaft, Munich, Fed. Rep. of Germany

[21] Appl. No.: 667,741

[22] Filed: Nov. 2, 1984

[30] Foreign Application Priority Data

Nov. 7, 1983 [DE] Fed. Rep. of Germany ....... 3340147

[51] Int. Cl.$^4$ .............................................. H05K 3/30
[52] U.S. Cl. ...................................... 29/838; 29/566.3;
29/707; 29/741; 83/62.1; 83/522; 83/925 R;
227/1; 227/7
[58] Field of Search ................ 29/566.3, 566.2, 566.1,
29/564.8, 705, 706, 707, 708, 714, 720, 741, 753,
837, 838; 227/1, 7, 79, 90; 83/62.1, 409.2, 522,
925 R, 926 B

[56] References Cited

U.S. PATENT DOCUMENTS

| | | |
|---|---|---|
| 2,758,303 | 8/1956 | Dow et al. .......................... 227/1 |
| 2,867,810 | 1/1959 | Gagnon .......................... 29/741 X |
| 2,893,009 | 7/1959 | Bergsland et al. ...................... 227/7 |
| 4,218,817 | 8/1980 | Takano .............................. 29/741 |
| 4,286,379 | 9/1981 | Kawa et al. .......................... 29/705 |
| 4,288,914 | 9/1981 | Vancelette .......................... 29/741 |
| 4,485,548 | 12/1984 | Janisiewicz ...................... 29/566.3 |
| 4,499,649 | 2/1985 | Maxner .......................... 29/566.3 |

*Primary Examiner*—Z. R. Bilinsky
*Attorney, Agent, or Firm*—Kenyon & Kenyon

[57] ABSTRACT

A device for mounting an integrated circuit with two rows of terminal pins to a circuit board comprises a pair of stationary knives and a pair of movable knives, each stationary knife overlying the respective movable knife on opposite sides of a stationary anvil member. Each stationary knife is provided in the region of its cutting edge with a multiplicity of spaced parallel slots extending transversely to the cutting edge, whereby the stationary knife is formed in the region of the cutting edge with a multiplicity of cutting tabs. Each cutting tab is connected to a respective strain gauge strip in turn electrically connected to a processing or monitoring circuit by means of a multiplicity of leads. The monitoring circuit detects the electrical resistances of the strain gauge strips and thereby determines whether the corresponding cutting tab has been loaded or engaged by a terminal pin during a bending and severing operation. The monitoring circuit includes a microprocessor and a display.

19 Claims, 7 Drawing Figures

DEVICE FOR MOUNTING ELECTRONIC COMPONENTS TO CIRCUIT BOARD

BACKGROUND OF THE INVENTION

This invention relates to a device for mounting electronic components, particularly multiple-pin integrated circuits, to circuit boards.

In the automatic mounting of multiple-pin electronic components, such as integrated circuits having 4 to 40 pins or contact legs, to circuit boards, insertion errors occur frequently. Such insertion errors occur, for example, when the contact pins of the electronic components are misaligned with the respective holes or openings in the circuit board. During a motion of the electronic component toward the circuit board in an insertion operation, the misaligned contact pins buckle upon contact with the surface of the circuit board. The undesirable result of the insertion errors is the existence of faulty connections in the electric circuit on the circuit board.

To check for the occurrence of insertion errors in the mounting of multiple-pin integrated circuit components to circuit boards, automatically assembled subassemblies have been conventionally subjected to a visual inspection after the insertion operation. The visual inspection is directed in particular to determining that the inserted terminal pins of each electronic component appear in pairs.

The visual inspection process has been facilitated by producing an image of the terminal pins on a piece of paper through the use of carbon paper and a rubber pressure roll. Furthermore, as described in commonly owned U.S. patent application Ser. No. 607,908, a device for mounting electronic components to circuit boards may be provided in the region of a support anvil with an optical monitoring device for detecting the ends of the terminal pins protruding from the circuit board on a side thereof opposite the electronic component.

An object of the present invention is to provide an improved mounting device of the above-described type which includes means for automatically monitoring the assembly process for the occurrence of insertion errors.

Another, more particular object of the present invention is to provide such a mounting device in which the automatic monitoring operation occurs during the assembly process.

Another, more particular, object of the present invention is to provide such an improved mounting device in which insertion errors can be detected for electronic components having two rows of at least two terminal pins each.

SUMMARY OF THE INVENTION

The present invention is directed to a device for mounting an electronic component having a plurality of contact pins to a circuit board provided with a plurality of openings, the contact pins being receivable by the openings in the circuit board. The device comprises an anvil member for supporting the circuit board during insertion of the contact pins of the electronic component through the openings in the circuit board and for supporting the circuit board and the electronic component during a subsequent bending and cutting operation. The device further comprises a fastener assembly including a plurality of knives comprising at least one stationary knife and a cooperating movable knife for bending and severing the contact pins upon insertion thereof through the openings in the circuit board. The stationary knife and the movable knife are disposed in the region of the anvil member and at least one of the knives has a cutting edge provided with a plurality of spaced parallel slots extending substantially transversely to the cutting edge, whereby the slotted knife is formed at its cutting edge with a plurality of cutting lugs or tabs. A plurality of gauge strain strips are connected to respective lugs, while a monitoring circuit is provided for detecting changes in the electrical resistances of the strain gauge strips.

In accordance with another feature of the present invention, the slotted knife has a body portion provided on an upper surface with a plurality of recesses. A plurality of electrical leads are provided, each lead being connected to a respective strain gauge strip, the strips and the leads being disposed in the recesses on the body portion of the knife. The leads extend to the monitoring circuit preferably via a plurality of terminal contacts and through a common electrical cable. The slotted knife is advantageously provided with a closure member attachable to the body portion of the slotted knife in a form-fitting manner for covering the recesses.

In accordance with another feature of the present invention, the monitoring circuit advantageously includes a plurality of amplifiers each operatively connected to a respective strain gauge strip. Alternatively, the monitoring circuit may include a single amplifier, the mounting device further comprising a time-division coupling circuit operatively connected to the strain gauge leads and to the monitoring circuit for connecting the strain gauge strips individually to the amplifier circuit in a cyclic sequence.

The monitoring circuit advantageously includes a microprocessor and a display operatively connected thereto, whereby the mounting status of the electronic component may be visually checked by an operator.

A device in accordance with the present invention may be utilized in a method for mounting a multiple-pin electronic component to a circuit board, wherein the electronic component is provided with two parallel rows of contact pins. The method comprises the steps of: (a) placing the contact board on the anvil member, (b) inserting the contact pins of the electronic component through openings in the circuit board, and (c) bending and severing the contact pins by the fastener upon insertion of the contact pins of the electronic component through the openings in the circuit board. Further steps include: (d) transmitting electric currents through the strain gauge strips during the bending and severing of the contact pins, (e) detecting the electrical resistances of the strain gauge strips via the electric current applied to the strain gauge strips during the transmission of electric current therethrough, and (f) comparing the detected electrical resistance of a strain gauge strip corresponding to a first contact pin in one of the rows on the electronic component with the detected electrical resistance of another strain gauge strip corresponding to a second contact pin in the other of the rows on the component to determine whether one of the pair of pins was incorrectly inserted through the respective opening in the circuit board.

Pursuant to a particular feature of the present invention, the method of mounting a component to a circuit board further comprises the steps of (g) determining the number of pairs of contact pins on the electronic component prior to the inserting of the pins through the openings in the circuit board, (h) automatically determining the number of pairs of contact pins having at least one pin properly inserted, and (i) automatically comparing the number determined in step (g) with the number determined in step (h) to determine whether the electronic component has one or more contact pin pairs in which both contact pins were incorrectly inserted.

The stationary and the movable cutting knives of a mounting device in accordance with the present invention function to simultaneously bend outwardly and to cut to the proper length the contact pins of a multiple-pin electronic component. Preferably, the stationary knife is disposed above the movable knife and is the knife having a cutting edge subdivided by slots. The slots are spaced from one another by approximately the same distance by which the terminal pins of the electronic component are spaced from each other. In this way, each contact pin is engageable by a respective cutting lug during the bending and severing operation. The compressive and bending forces acting on the cutting lugs are transmitted to the strain gauge strips. Whether a contact pin is properly inserted through the circuit board is detected by a change in the electrical resistance of the strain gauge strip associated with the cutting lug which engages the contact pin. If a contact pin has not been properly inserted through the respective opening in the circuit board, there is no change in the electrical resistance of the strain gauge strip associated with the respective cutting lug.

With a device in accordance with the present invention, insertion errors can be immediately detected during the insertion, bending and cutting operations. Owing to the immediate visual inspection via a microprocessor-operated display, defective components can be marked and recorded without interrupting or slowing down the operation of the automatic inserting machine. The marked or registered components having the insertion errors can then sent for repairs.

With a device according to the present invention, it is possible to obtain information about terminal pins which are bent over in pairs. To this end, the number of terminal pin pairs must be compared before and after the insertion operation. It is possible to provide a sensor at the mounting device for automatically determining the number of contact pin pairs prior to the insertion operation. A comparison between the number of terminal pin pairs before and after the insertion process can be immediately executed. Alternatively, the number of severed pins may be compared with the number of pins of the electronic component, as preprogrammed into the monitoring circuit or entered therein by means of a keyboard.

DETAILED DESCRIPTION

Figure 1:
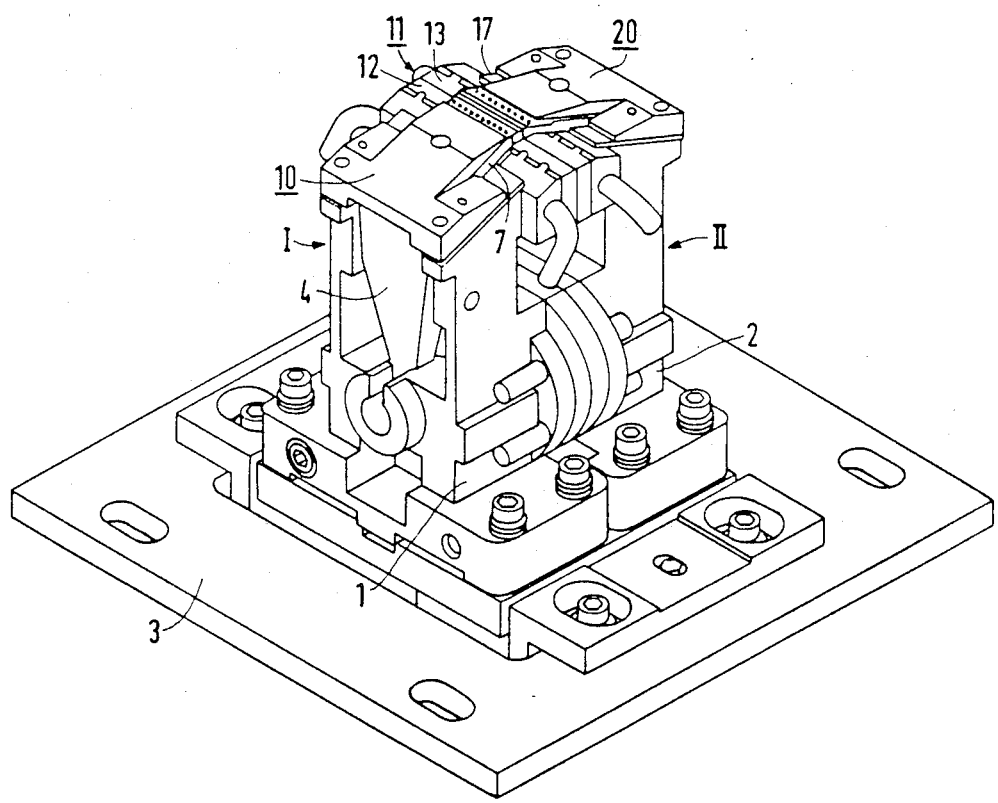
FIG. 1 is a perspective view of a mounting device having features in accordance with the present invention.

As illustrated in FIG. 1, the present invention is implementable in a commercially available inserting device such as that supplied by the firm Universal Instruments Corp. The inserting or mounting device consists essentially of two mirror-symmetrical tool units I and II. Tool units I and II form a pair of clamping jaws 1 and 2 movably guided on a frame 3.

Figure 2:
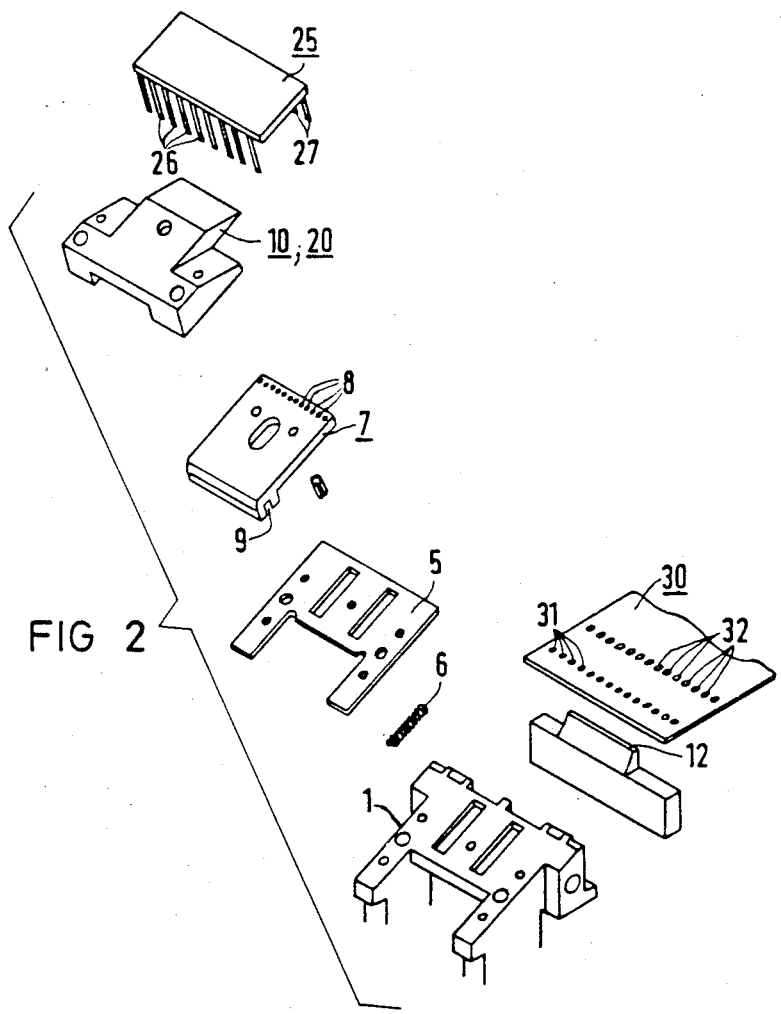
FIG. 2 is an exploded view of a portion of the device of FIG. 1, showing stationary and movable knives, as well as a multiple-pin electronic component and a circuit board.

As illustrated in detail in FIG. 2, each tool unit I and II comprises a movable lower knife 7 and a stationary upper knife 10 held on the respective clamping jaw 1 (or 2) via an intermediate plate 5. Biasing springs 6 are provided in the intermediate plate 5 for returning movable knife 7 to an unactuated position. Knife 7 is provided along one edge with a linear array of apertures 8 spaced from each other by a distance equal to the spacing between adjacent terminal pins in a first row of terminal pins 26 on an electronic component 25 such as an integrated circuit having two rows 26 and 27 of terminal pins.

Knife 7 is actuated by a toggle lever 4 (see FIG. 1) having an upper end disposed in a slot 9 extending parallel to the array of apertures 8 in the movable knife.

Tool unit II has the same structure as tool unit I and comprises a stationary knife 20 disposed above a movable knife 17. Between cutting tools I and II, an anvil member 11 is disposed. Anvil 11 includes portions 12 and 13 and is provided with inlet apertures as well as discharge apertures for scrap metal pieces and the like.

During a mounting operation, a circuit board 30 having two rows 31 and 32 of openings is placed on anvil. Electronic component 25 is then moved towards the circuit board, the terminal pins of rows 26 and 27 being aligned during this motion with the openings of rows 31 and 32, respectively. Upon the completion of the inserting operation, movable knives 7 and 17 are shifted laterally outwardly, thereby bending and severing the terminal pins which protrude through the bottom surface of the circuit board.

Figure 3:
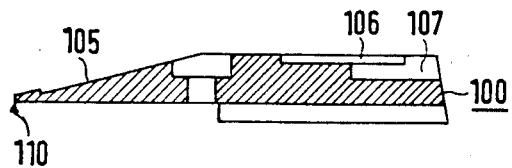
FIG. 3 is a cross-sectional view of the stationary knife of FIG. 2.
Figure 4:
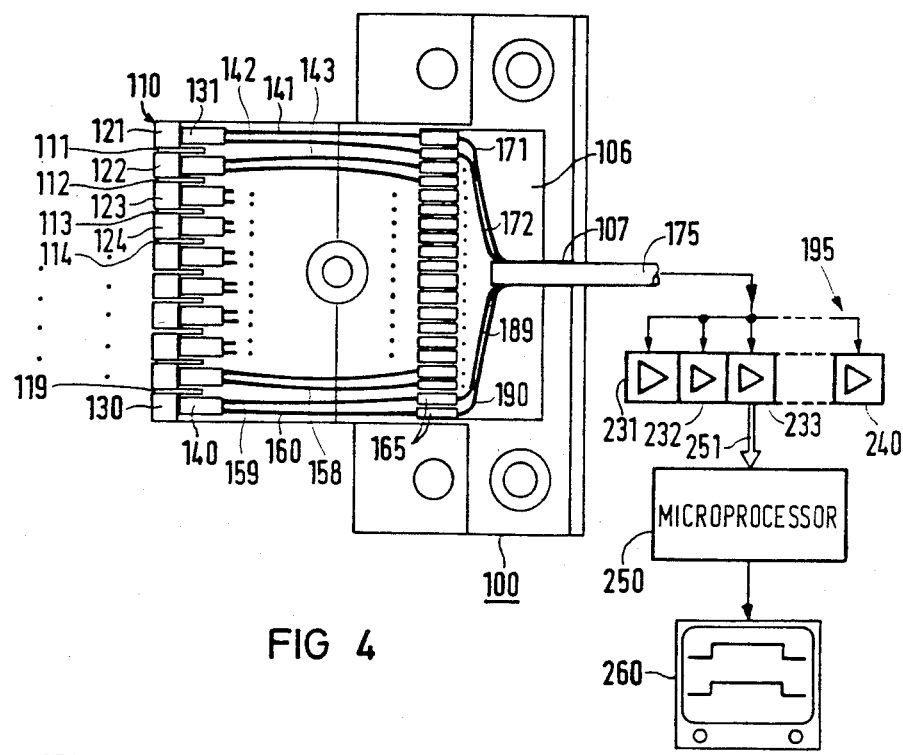
FIG. 4 is a top view of the stationary knife of FIGS. 2 and 3, showing strain gauge strips and a monitoring circuit including a plurality of amplifier stages.

As illustrated in FIGS. 3 and 4, each stationary knife 10 and 20 includes a shaped body portion 100 provided on an upper surface with recesses 105, 106 and 107 milled into the body portion 100. Body portion 100 has along one side a cutting edge 110 and is provided in the region of the cutting edge with a plurality of slots 111–119 extending substantially transversely to the cutting edge 110. The slots are preferably approximately 0.35 mm wide and have a depth or length of approximately 5 mm. The slots are spaced from one another at a distance approximately equal to the spacing between adjacent terminal pins in the rows of pins 26 and 27 on the integrated circuit 25. The slots form in the region of the cutting edge a plurality of individual tabs or cutting lugs 121–130.

In accordance with the present invention, a plurality of strain gauge strips 131–140 are attached to respective cutting lugs or tabs 121–130, the strain gauge strips, as well as leads 141–160 connected thereto, being disposed in recess 105 in the upper surface of body portion 100. Leads 141–160 extend to respective contact terminals 165 disposed in a linear array or strip in recess 106. From contact terminals 165 respective lead lines 171-190 extend through a common cable 175 to a plurality of amplifier stages 231-240 included in a signal processing or monitoring circuit 195. Each amplifier stage 231-240 is associated with a respective strain gauge strip 131-140 for processing electrical signals received therefrom. Monitoring or processing circuit 195 further includes a microprocessor 250 having an input multiple 251 with leads extending from the outputs of the amplifier stages 231-240. Microprocessor 250 is operatively connected to a display 260.

In the assembly of multiple-pin electronic components to circuit boards by means of a bending and severing operation, pressure and bending stresses are exerted on the cutting edge. By providing cutting edge 110 with a plurality of individual cutting tabs or lugs 121-130, the force exerted by each individual contact or terminal pin can be determined and the related signals processed separately. For this purpose, however, the signals with magnitudes related to the resistances of strain gauge strips 131-140 must first be preprocessed and preamplified in a suitable manner.

Figure 5:
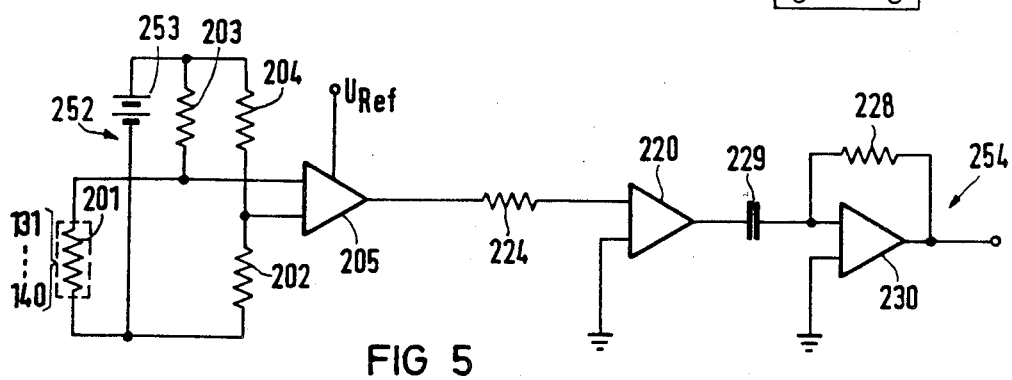
FIG. 5 is a circuit diagram of one of the amplifier stages shown in FIG. 4.

As illustrated in FIG. 5, each amplifier stage 231-240 comprises a bridge circuit 252, a bridge amplifier 205, a first operational amplifier 220 and a second operational amplifier 230. The bridge circuit includes four resistors 201-204 and a power source 253. Bridge amplifier 205 is connected to a multiplicity of capacitors and ohmic resistors (not illustrated) in a manner well known in the art. A reference voltage is adjustable from a standard voltage source via resistors. FIG. 5 omits individual circuit details, as these are well known in the art.

Bridge amplifier 205 is connected via a resistor 224 to operational amplifier 220 which is connected in a manner known per se to ohmic resistors and capacitors (not illustrated). To avoid any drift effects of the amplifier stage or bridge circuit, capacitive coupling is provided in the form of a capacitor 229 connected between the output of amplifier 220 and an input of amplifier 230. Amplifier 230 is provided with a feedback loop 254 including a resistor 228.

Amplifier stages 230-240 provide, in addition to a suitable gain, an output signal independent of the drift of the individual components. As a result, a binary signal is present at the output of operational amplifier 230, the low-level logic signal signifying that no cutting operation has taken place at a terminal pin and, therefore, that an insertion error has occurred. Concomitantly, the high-level logic signal signifies that the respective terminal pin has been correctly inserted, bent and severed.

Microprocessor 250 may be programmed to display on screen or monitor 260 a square wave signal in which each high-level pulse represents a properly connected terminal pin of the electronic component. Alternatively or additionally, microprocessor 250 may be programmed to indicate on monitor 260 the identity of faulty connections by means of an alphanumeric code.

Figure 6:
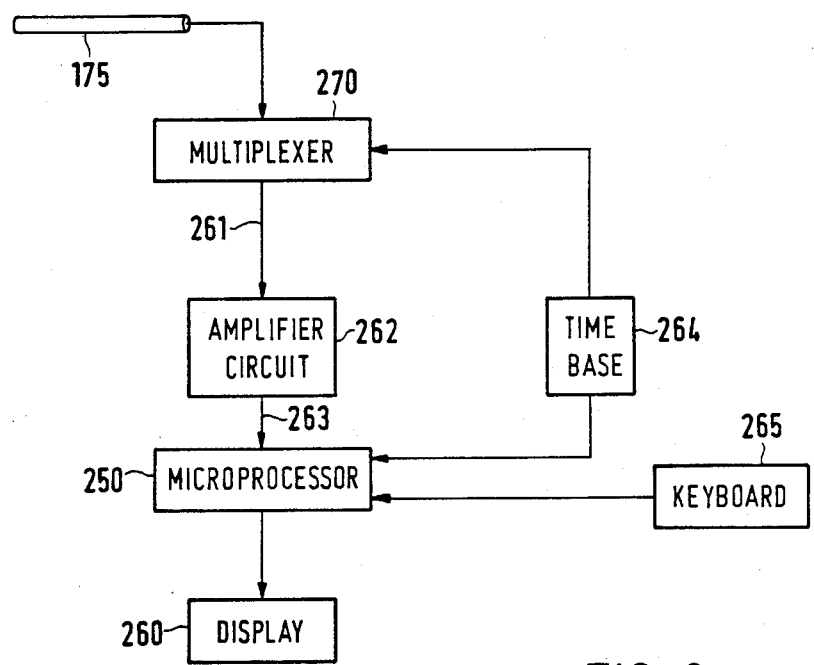
FIG. 6 is a block diagram showing an alternative form of the monitoring circuit of FIG. 4.

As illustrated in FIG. 6, strain gauge strips 131-140 may be connected via leads 141-160, terminal contacts 165, and leads 171-190 to a multiplexer 270 in turn connected via a output lead 261 to a single amplifier circuit 262. Amplifier circuit 262 in turn has an output lead 263 working into microprocessor 250. The timing of the switching operations in multiplexer 270 is controlled by a time base 264, this time base 264 also being connected to microprocessor 250 for synchronizing the processing operations thereof with the switching operations of multiplexer 270. A keyboard 265 is connected to microprocessor 250 for entering thereinto the number of terminal pin pairs of an integrated circuit to be mounted to a circuit board by a device in accordance with the present invention.

Amplifier circuit 262 advantageously has the same internal structure as amplifier stages 231-240. Under the control of time base 264 multiplexer 270 feeds to microprocessor 250 via amplifier circuit 262 electrical signals from strain gauge strips 131-140 in a cyclic sequence.

Figure 7:
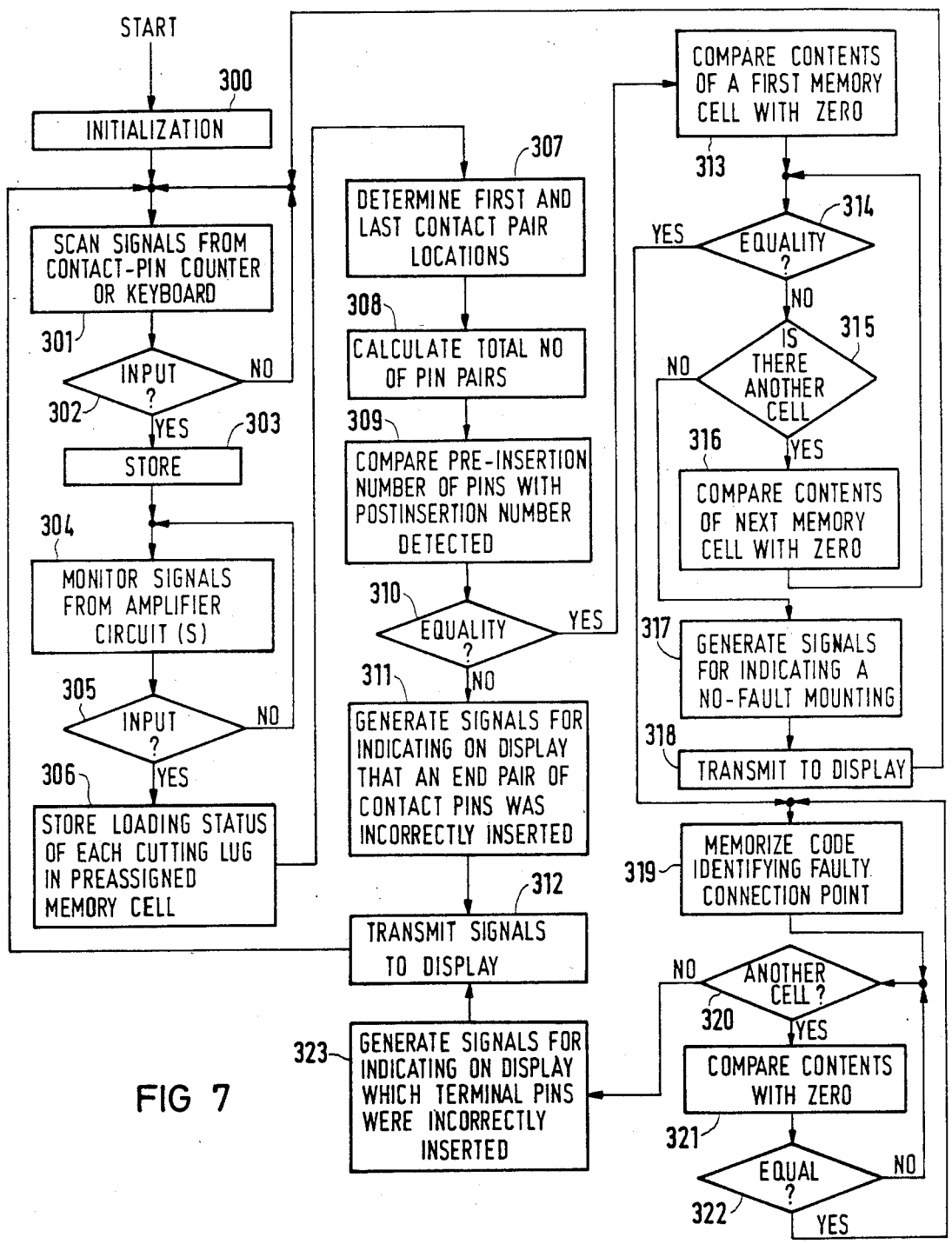
FIG. 7 is a flow-chart diagram indicating a sequence of operations for a microprocessor included in the monitoring circuits of FIGS. 4 and 6.

As illustrated in FIG. 7, microprocessor 250 begins with an initialization step 300 and then undertakes a scan 301 of signals arriving from keyboard 265 or from an automatic device such as an optical reader (not illustrated) which counts the number of contact or terminal pins on an integrated circuit. Upon completion of the scan 301, microprocessor 250 inquires at a decision junction 302 whether there has been any input relating to the number of terminal pin pairs of an electronic component to be mounted to a circuit board. If the result of the inquiry is negative, the microprocessor 250 continues the scan, while if the result of the inquiry is positive, microprocessor 250 stores, in a step 303, the encoded number of contact pins in a preselected memory location. Microprocessor 250 then monitors signals from amplifier circuit 262 or, alternatively, amplifier stages 231-240 (step 304). Upon the arrival of signals indicating that a bending and severing operation is taking place, as determined by microprocessor 250 at a decision junction 305, the microprocessor 250 stores, in a step 306, the loading status of each cutting lug or tab 121-130 in respective preselected memory cells. From the stored information, the first and the last contact pin pair locations are determined by microprocessor 250 in a step 307. Micro-processor 250 then calculates the total number of pin pairs (in step 308). In a subsequent step 309, the pre-insertion number of terminal pin pairs, as fed to the microprocessor in step 301, is compared with the post-insertion number of terminal pin pairs, as detected by the monitoring circuit during the bending and severing operation. If this comparison fails to yield an equality, as detected by the microprocessor 250 at a decision junction 310, microprocessor 250 generates signals (step 311) for indicating on display or monitor 260 that both members of an impair of contact pins were incorrectly inserted. In a step 312 the signals are transmitted to the display. Microprocessor 250 then returns to the scanning step 301.

If the comparison of step 309 yields an equality, as determined at decision junction 310, the contents of a first memory cell are compared with zero in a step 313. If the contents are non-zero, as determined in an inquiry 314, microprocessor 250 ascertains at a decision junction 315 whether there is another cell into which a signal has been loaded during a current mounting operation. If there is another such cell, the contents of that cell are compared with zero in a comparison step 316. If the contents of this cell are non-zero, microprocessor 250 continues to examine the contents of all the cells storing information pertinent to the current mounting operation. If the contents of all the cells are non-zero, as determined in the sequence of operations 314-316, microprocessor 250 generates signals in a step 317 for indicating that the mounting has been successful. These signals are transmitted in a step 318 to display or monitor 260. Microprocessor 250 then returns to the scanning step 301.

Upon detecting that at least one of the terminal pins of the electronic component has been inserted incorrectly, microprocessor 250 memorizes a code identifying the terminal pin having a faulty connection (step 319). Upon the memorization of the identification code, the microprocessor 250 inquires at a decision junction 320 whether there is another cell containing information pertinent to the current mounting operation. If the outcome of the inquiry is affirmative, the contents of the next memory cell are compared with zero in a comparison step 321. If the contents are zero, the microprocessor 250 proceeds to step 319 and memorizes the identification code of the terminal pin corresponding to the memory cell being examined. Upon completing the examination of all the memory cells in the sequence of steps 319–322, microprocessor 250 generates signals in a step 323 for indicating on monitor 260 which terminal pins of the electronic component for incorrectly inserted during the insertion operation. These signals are then transmitted to the monitor 260.

The microprocessor program illustrated in FIG. 7 can be simplified by including a step of comparing the contents of the memory cell associated with each terminal pin in a row of terminal pins with the contents of the memory cell associated with a corresponding terminal pin in the other row of pins on the electronic component. An inequality would indicate that one of the pins was incorrectly inserted, while equality would indicate that both pins of the pair were correctly inserted, it being unlikely that both pins of a pair would be incorrectly inserted.

Although the invention has been described in terms of specific embodiments and applications, persons skilled in the art, in light of this teaching, can generate additional embodiments without exceeding the scope or departing from the spirit of the claimed invention. Accordingly it is to be understood that the drawings and descriptions in this disclosure are proffered to facilitate comprehension of the invention and should not be construed to limit the scope thereof.

What is claimed is:

1. A device for mounting an electronic component having a plurality of contact pins to a circuit board provided with a plurality of openings, said contact pins being receivable by said openings, said device comprising:
   support means including an anvil member for supporting the circuit board during insertion of the contact pins of the electronic component through the openings in said circuit board and for supporting said circuit board and said electronic component during subsequent bending and cutting operations;
   fastening means including a plurality of knives comprising at least one stationary knife and a cooperating movable knife for bending and severing said contact pins upon insertion thereof through said openings, said stationary knife and said movable knife being disposed in the region of said anvil member, at least one of said knives having a cutting edge provided with a plurality of spaced parallel slots extending substantially transversely to said cutting edge, whereby said one of said knives is formed at said cutting edge with a plurality of cutting lugs;
   plurality of strain gauge strips each connected to a respective one of said lugs;
   monitoring means for detecting changes in the electrial resistances of said strain gauge strips; and
   linking means for electrically coupling said monitoring means to said strain gauge strips.

2. The device defined in claim 1 wherein said one of said knives is said stationary knife.

3. The device defined in claim 2 wherein said stationary knife is disposed above said movable knife.

4. The device defined in claim 3 wherein said stationary knife has a body portion provided on an upper surface with a plurality of recesses and wherein said linking means includes a plurality of electrical leads each connected to a respective one of said strain gauge stripe, said strain gauge strips and said leads being disposed in said recesses.

5. The device defined in claim 4 where said linking means further includes an array of terminal contacts and a cable, said leads extending to said monitoring means via respective ones of said terminal contacts and through said cable.

6. The device defined in claim 4 wherein said body portion is provided with closure means including a cover attachable to said body portion in a form-fitting manner for covering said recesses.

7. The device defined in claim 4 wherein said monitoring means includes a plurality of amplifier circuits at least equal in number to said strain gauge strips, said strain gauge strips being operatively connected to respective ones of said amplifier circuits.

8. The device defined in claim 4 wherein said monitoring means includes a single amplifier circuit, further comprising time-division coupling means operatively connected to said linking means and to said monitoring means for connecting said strain gauge strips individually to said amplifier circuit in a cyclic sequence.

9. The device defined in claim 1 wherein said one of said knives has a body portion provided on an upper surface with a plurality of recesses and wherein said linking means includes a plurality of electrical leads each connected to a respective one of said strain gauge strips, said strain gauge strips and said leads being disposed in said recesses.

10. The device defined in claim 9 wherein said linking means further includes an array of terminal contacts and a cable, said leads extending to said monitoring means via said terminal contacts and through said cable.

11. The device defined in claim 9 wherein said body portion is provided with closure means including a cover attachable to said body portion in a form-fitting manner for covering said recesses.

12. The device defined in claim 1 wherein said stationary knife and said movable knife are disposed one above the other, said one of said knives comprising an upper one of said stationary knife and said movable knife.

13. The device defined in claim 1 wherein said monitoring means includes a plurality of amplifier circuits at least equal in number to said strain gauge strips, said strain gauge strips being operatively connected to respective ones of said amplifier circuits.

14. The device defined in claim 1 wherein said monitoring means includes a single amplifier circuit, further comprising time-division coupling means operatively connected to said linking means and to said monitoring means for connecting said strain gauge strips individually to said amplifier circuit in a cyclic sequence.

15. The device defined in claim 1 wherein said monitoring means includes a microprocessor and a display operatively connected thereto, whereby the mounting status of said electronic component may be visually checked by an operator.

16. The device defined in claim 1 wherein said electronic component is provided with two parallel rows of contact pins, said monitoring means including means for comparing the mounting status of a contact pin in one of said rows with the mounting status of a corresponding contact pin in the other of said rows to determine whether an error in the mounting of said electronic component to said circuit board has occurred.

17. A method utilizing the device of claim 1 for mounting the electronic component to the circuit board, said electronic component being provided with two parallel rows of contact pins, said method comprising the steps of:
   placing said circuit board on said anvil member;
   inserting the contact pins of said electronic component through the openings in said circuit board;
   bending and severing said contact pins by said fastening means upon insertion of said contact pins through said openings;
   transmitting electric currents through said strain gauge strips via said linking means during said step of bending and severing;
   detecting electrical resistances of said strain gauge strips via the electric currents applied to said strain gauge strips during said step of transmitting; and
   comparing the detected electrical resistance of a strain gauge strip corresponding to a first contact pin in one of the rows on said electronic component with the detected electrical resistance of another strain guage strip corresponding to a second contact pin in the other of said rows to determine whether one of said first and said second contact pin was incorrectly inserted through a respective opening in said circuit board.

18. The method defined in claim 17, further comprising the steps of: (a) determining the number of pairs of contact pins on said electronic component prior to said step of inserting, (b) automatically determining the number of pairs of contact pins having at least one pin properly inserted, and (c) automatically comparing the number determined in step (a) with the number determined in step (b) to determine whether said electronic component has a contact pin pair in which both contact pins were incorrectly inserted during said step of inserting.

19. The method defined in claim 18 wherein the steps of comparing, automatically determining and automatically comparing are executed by a microprocessor.

* * * * *